United States Patent
Oyagi

(10) Patent No.: US 6,292,232 B1
(45) Date of Patent: Sep. 18, 2001

(54) RECEIVING APPARATUS

(75) Inventor: Kazuhiro Oyagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/078,618

(22) Filed: May 14, 1998

(30) Foreign Application Priority Data

May 15, 1997 (JP) ................................. 09-126045

(51) Int. Cl.[7] ................. H03J 5/00; H03J 3/06
(52) U.S. Cl. ............... 348/725; 348/735; 725/68; 455/131; 455/3.2; 455/280
(58) Field of Search ................. 348/725, 735, 348/613; 455/131, 234.1, 234.2, 239.1, 318, 3.02, 280, 289, 291, 293; 333/160; 725/68, 72; H03J 5/00, 3/06

(56) References Cited

U.S. PATENT DOCUMENTS

| | | | | |
|---|---|---|---|---|
| 4,028,644 | * | 6/1977 | Niiro ........................................ 333/16 |
| 4,608,710 | * | 8/1986 | Sugiura ...................................... 455/4 |
| 5,134,707 | * | 7/1992 | Sakashita et al. ..................... 455/3.2 |
| 5,276,918 | * | 1/1994 | Cornforth et al. .................... 455/127 |
| 5,502,715 | * | 3/1996 | Penny ....................................... 370/26 |
| 5,523,801 | * | 6/1996 | Tanaka et al. ......................... 348/737 |
| 5,745,847 | * | 4/1998 | Matsuo ............................... 455/234.1 |
| 5,754,943 | * | 5/1998 | Arai et al. ............................... 455/14 |
| 5,758,272 | * | 5/1998 | Hong ................................... 455/234.2 |
| 5,758,274 | * | 5/1998 | Vu et al. .............................. 455/246.1 |

FOREIGN PATENT DOCUMENTS

| | | | |
|---|---|---|---|
| 357173231 | * | 10/1982 | (JP) . |
| 405022175 | * | 1/1993 | (JP) . |
| 409116453 | * | 5/1997 | (JP) . |

* cited by examiner

Primary Examiner—Reinhard J. Eisenzopf
Assistant Examiner—Brian P. Yenke
(74) Attorney, Agent, or Firm—Jay H. Maioli

(57) ABSTRACT

A receiver invention includes an antenna circuit unit having a high-frequency amplifier circuit connected to a reception antenna, a receiving circuit having a channel selection key, and a coaxial cable for connecting the antenna circuit unit and the receiving circuit. The receiving circuit includes a voltage adding circuit for adding, upon channel selection based on an operation of the channel selection key, a DC voltage corresponding to a frequency band to an AGC signal to supply it to the high-frequency amplifier circuit through the coaxial cable. A high-frequency gain of the high-frequency amplifier circuit is changed by using a voltage corresponding a frequency band of a received broadcasting frequency and an electric field intensity thereof.

2 Claims, 4 Drawing Sheets

RECEIVING APPARATUS

BACKGROUND

1. Field of the Invention

The present invention relates to a receiving apparatus especially for receiving a high-frequency wave which can receive a plurality of waves of different frequency bands.

2. Background of the Invention

A reception hazard called snow noise in which interference resulting from noise caused by heat generated in a television receiver or the like has been known. If a level of a signal input to a receiver is large, then snow noise is not so remarkable. If on the other hand the input signal level becomes small, this interference becomes remarkable, which results in an unsatisfactory picture. This results from a weak reception electric field, a large loss in a long transmission line such as a coaxial cable or the like. A generally well known method of improving the snow noise interference is to connect a high-frequency amplifier called as a booster to a reception antenna to supply a received signal amplified (or attenuated) by the booster to circuits at the succeeding stage.

Programs of Japanese television broadcasting using ground waves are broadcasted by using different frequency bands, e.g., a VHF low channel (ranging from 90 MHz to 108 MHz), a VHF high channel (ranging from 170 MHz to 222 MHZ), and a UHF channel (ranging from 470 MHz to 770 MHz).

Programs of a digital audio broadcasting (DAB) recently started in Europe are broadcasted by using different frequency bands, e.g., a frequency band substantially ranging from 170 MHz to 240 MHz and a frequency band substantially ranging from 1450 MHz to 1500 MHz.

When a plurality of transmitted waves of high frequencies transmitted in different frequency bands set at an interval are received, it is the best method to receive the transmitted waves by using antennas dedicated for respective reception frequency bands. However, when a car-mount receiving apparatus and the like are used, design and layout of a car sometimes makes it difficult to provide a plurality of antennas therein. Therefore, a method of receiving a plurality of waves of high-frequency signals using different frequency bands by using only one reception antenna to input the received signals to a receiver through a coaxial cable is generally known. In this case, it is considered that a high-frequency amplifier such as the above booster or the like is connected to an antenna.

Since a gain of the high-frequency amplifier is fixed, the above arrangement is effective when an electric-field intensity transmitted to the reception antenna is comparatively weak. However, in a region with a strong electric field, such as a region near a transmitting station or the like, a high-frequency amplifier generates a nonlinear distortion, which aggravates its reception state. In particular, if a DAB receiver employing, for modulation of a broadcasting wave, an orthogonal frequency division multiplexing (OFDM) system which is one kind of multicarrier modulation system is employed, the broadcasted wave is a multicarrier wave and hence, if a transmission line has nonlinear characteristics, deterioration of characteristics resulting from intermodulation occurs, which leads to degradation of the reception.

When an antenna for receiving a plurality of high-frequency signals whose frequency bands are separated at a considerable interval is employed, it is difficult to set high-frequency gains in the respective frequency bands equal to one another. Moreover, a transmission attenuation amount of a coaxial cable is expressed by a sum of attenuation resulting from high-frequency resistance of a conductor and attenuation amount resulting from high-frequency dielectric loss of an insulator, and a dielectric loss in a VHF band is only several percentage or smaller, which means that the attenuation resulting from the high-frequency resistance of the conductor influences the total attenuation amount. Since the attenuation resulting from the high-frequency resistance is substantially proportional in a square root of a frequency, the attenuation amount of the coaxial cable represents a $\sqrt{f}$ characteristic.

Therefore, even if high-frequency signals of different frequency bands with similar electric intensities are transmitted, levels of the signals input to the receiver are varied depending upon their frequencies.

SUMMARY OF THE INVENTION

In view of such aspects, it is an object of the present invention to provide a receiving apparatus which changes a gain of a high-frequency component at a reception antenna unit in response to a frequency band of a signal received by the reception antenna and a reception electric field intensity thereof and which can compensate among reception electric intensities differing depending upon frequencies of the received signals.

A receiving apparatus according to the present invention is a receiving apparatus in which a reception antenna circuit unit having at least a high-frequency amplifier circuit for receiving a plurality of signals in different frequency bands and a receiving circuit unit are separated and the reception antenna circuit unit and the receiving circuit unit are connected to each other through a transmission line. The receiving apparatus according to the present invention is arranged such that an automatic gain voltage derived from the reception circuit unit side is supplied to the high-frequency amplifier unit of the antenna circuit unit in response to a frequency band of a signal received in accordance with each selection of a channel and a reception electric field intensity, thereby a high-frequency gain being controlled.

Since the receiving apparatus is arranged such that different voltages are supplied through the transmission line to the high-frequency amplifier circuit connected to the reception antenna in response to the frequency band and the reception electric field intensity, it is possible to obtain a receiving apparatus which can stably receive signals by changing the high-frequency gain at the reception antenna in response to the frequency band and the reception electric field intensity.

DETAILED DESCRIPTION OF THE PREFERRED EMBODIMENT

A receiving apparatus according to an embodiment of the present invention will be described in detail with reference to the accompanying drawings.

Figure 1:
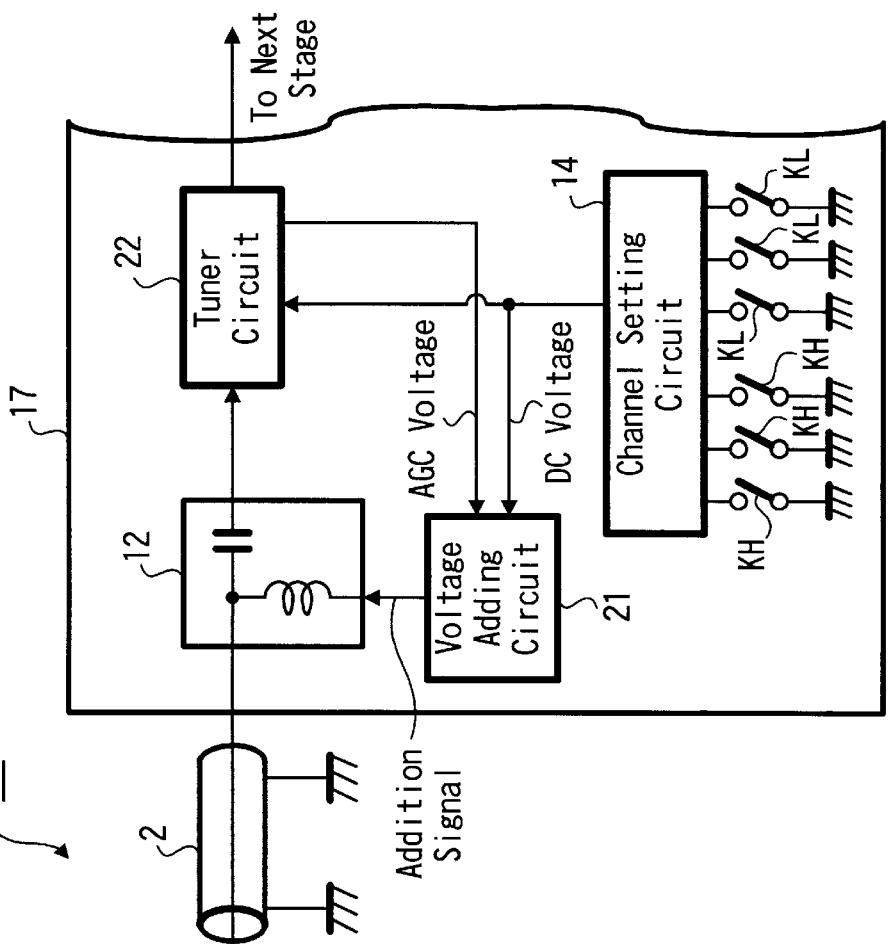
FIG. 1 is a systematic diagram showing a receiving apparatus according to the present invention.
Figure 2:
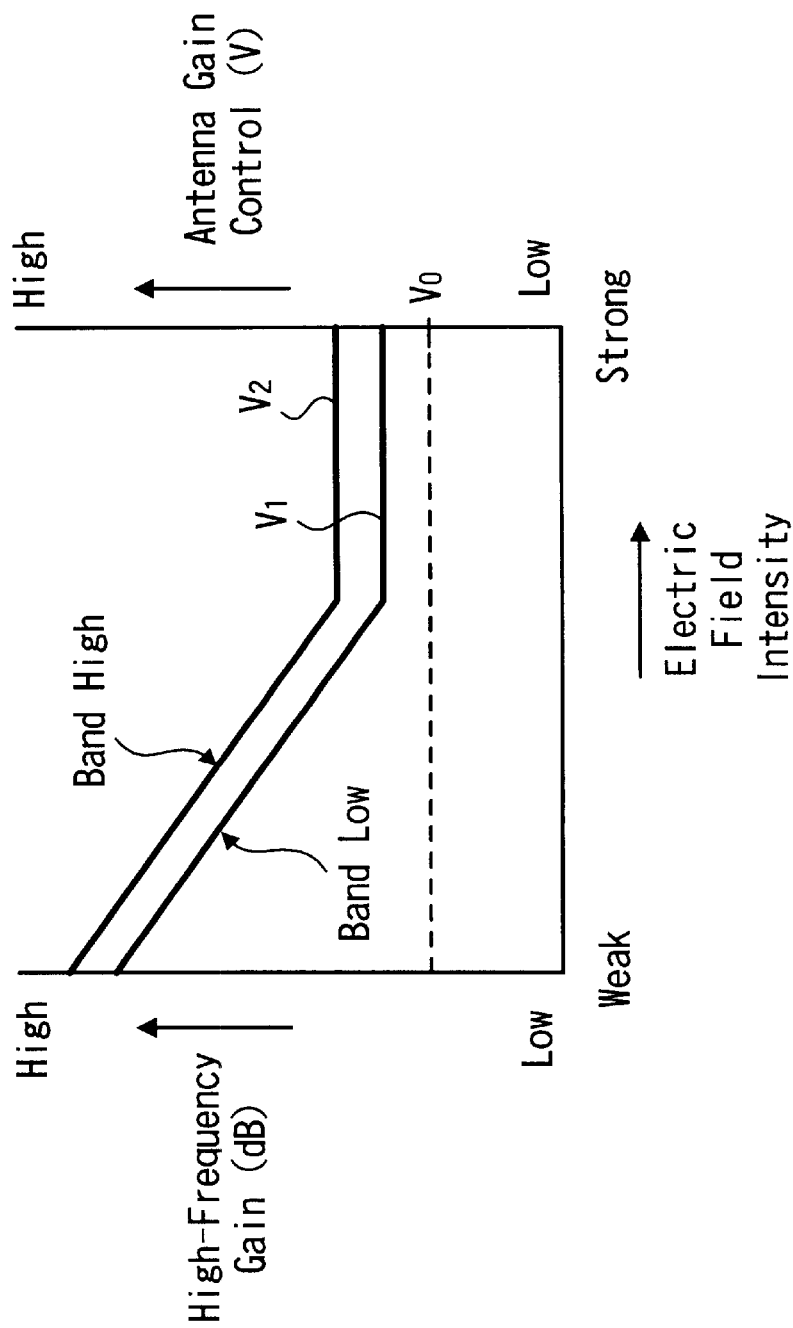
FIG. 2 is a graph of characteristic curves of an antenna gain control voltage used for the receiving apparatus according to the present invention.

FIG. 1 is a systematic diagram showing a receiving apparatus according to the present invention. FIG. 2 is a characteristic curve graph showing a relationship between an antenna gain control voltage and an electric field intensity.

A receiving apparatus 19 according to the present invention is arranged such that the receiving apparatus 19 is divided into an antenna circuit unit 23 having a high-frequency amplifier circuit 5 connected to a reception antenna 1 and a receiving circuit unit 17 including a tuner circuit 22, a channel setting circuit 14 and so on and that the antenna circuit unit 23 and the receiving circuit unit 17 are connected through a transmission line formed of a coaxial cable 2.

If this receiving apparatus 19 is mounted on a car, the reception antenna 1 is protruded outward from a body of the car and its root portion is fixed on an outer surface of the body. The antenna circuit unit 23 is provided in this fixed portion.

In this embodiment, the channel setting circuit 14 is arranged so as to select channels in two frequency bands, i.e., a band High and a band Low, spaced at a predetermined frequency interval. The channel setting circuit 14 has a plurality of channel selection keys KH used for selecting frequencies in the band High and a plurality of channel selection keys KL used for selecting frequencies in the band Low. When a user operates one of the keys KH and KL, the channel setting circuit 14 supplies voltages corresponding to the operated key to a voltage adding circuit 21 and a frequency circuit of the tuner circuit 22.

As shown in FIG. 1, a received radio wave signal received by the reception antenna 1 is supplied to the high-frequency amplifier circuit 5. The high-frequency amplifier circuit 5 amplifies or attenuates the signal and supplies a high-frequency signal to a first signal separating circuit 11 formed of a filter that is a capacitor and a coil for blocking a DC component and passing an AC component. The first signal separating circuit 11 passes only the high-frequency signal and then supplies the high-frequency signal through a transmission line such as a coaxial cable 2 or the like to a second signal separating circuit 12 disposed in the receiving circuit unit 17 that is a filter formed of a capacitor and a coil for blocking a DC component and passing an AC component.

The tuner circuit 22 includes, as well known, a frequency converter circuit, an intermediate frequency amplifier circuit and an envelope detecting circuit, and supplies a signal detected by the envelope detecting circuit to an audio amplifier circuit at the succeeding stage. An automatic gain control voltage (hereinafter referred to as an AGC voltage) derived from the envelope detecting circuit is supplied to the voltage adding circuit 21.

Generally, the AGC voltage is used to obtain a certain detection level by automatically controlling a gain of the receiving apparatus 19 in response to the intensity of the received radio wave.

The voltage adding circuit 21 is supplied with a DC voltage having a value which differs depending upon a reception frequency band set by the channel setting circuit 14, and then supplies an AGC voltage (hereinafter referred to as an addition signal) added with a DC voltage therefrom to the second signal separating circuit 12.

The addition signal supplied to the second signal separating circuit 12 is further supplied through the coaxial cable 2 to the first signal separating circuit 11. The first signal separating circuit 11 removes a high-frequency signal from the addition signal and then supplies the high-frequency signal to a constant voltage circuit 20 and the high-frequency amplifier circuit 5.

The constant voltage circuit 20 generates a constant voltage which is used as a power source of the high-frequency circuit. Based on the addition signal, an antenna gain control signal $E_{AGC}$ is supplied through a feedback line 24 to the high-frequency amplifier 5 to control the gain of the high-frequency amplifier circuit 5.

FIG. 2 is a graph showing an example of a characteristic curve of the antenna gain control voltage $E_{AGC}$ used for controlling the gain of the high-frequency amplifier circuit 5 according to the present invention. In FIG. 2, the ordinate axis represent a high-frequency gain and an antenna gain control voltage, and an abscissa represents an electric field intensity. In FIG. 2, a high frequency band is represented as a band High, and a low frequency band is represented as a band Low. As described above, the antenna gain control voltage $E_{AGC}$ is fed from the receiving unit 17 through the coaxial cable 2, the first signal separating circuit 11 and the feedback line 24 back to the high-frequency amplifier circuit 5.

A voltage value of the antenna gain control voltage $E_{AGC}$ obtained when a channel in the band High is selected by the channel setting circuit 14 is $V_2$ as shown in FIG. 2, and a voltage value of the antenna gain control voltage $E_{AGC}$ obtained when a channel in the band Low is selected by the channel setting circuit 14 is $V_1$ as shown in FIG. 2.

Moreover, as shown in FIG. 2, minimum values of the voltage values $V_1$ and $V_2$ of the antenna gain control voltages $E_{AGC}$ of the band are set higher than a minimum voltage $V_0$ required for the constant voltage circuit 20 to generate a certain voltage.

Therefore, if the voltages $V_1$ and $V_2$ of the antenna gain control voltages $E_{AGC}$ are supplied to the high-frequency amplifier circuit 5, then it means that a power source voltage which is enough to drive the high-frequency amplifier circuit 5 is supplied thereto.

When the antenna gain control voltage $E_{AGC}$ shown in FIG. 2 is employed, the receiving apparatus 19 employs a reverse automatic gain control (AGC) operated such that if the electric field intensity is weak, then the voltage value of the antenna gain control voltage $E_{AGC}$ is increased to increase the gain of the high-frequency amplifier circuit 5 and that if the electric field intensity is strong, then the voltage value of the antenna gain control voltage $E_{AGC}$ is deceased to decrease the gain of the high-frequency amplifier circuit 5. However, if a polarity and so on of a control element or the like of the high-frequency amplifier circuit 5 is changed, a forward AGC operated reversely thereto can be obtained.

Since the antenna gain in the band High is set to a high gain, the voltage $V_2$ of the antenna gain control voltage $E_{AGC}$ obtained when a channel in the band High is selected is constantly set higher than the voltage $V_1$ of the antenna gain control voltage $E_{AGC}$ obtained when a channel in the band Low is selected.

Since, through the above operations, the AGC voltage from the tuner circuit 22 is varied in response to the electric field intensity of a signal received by the reception antenna 1 and consequently the antenna gain control voltage $E_{AGC}$ as the addition signal is changed, the voltage values $V_1$ and $V_2$ supplied to the high-frequency amplifier circuit 5 are changed in response to the electric field intensity.

A constant voltage regulator may be employed as the constant voltage circuit 20 employed in the antenna circuit unit 23 for generating a power source voltage. A noninverting adding circuit employing an operational amplifier is employed as the voltage adding circuit 21. If an inverting adding circuit is employed, an addition result is inverted. Therefore, when the inverting adding circuit is employed, it is necessary to additionally provide an invertor or the like.

A DAB receiver to which the receiving apparatus according to the present invention is applied will be described with reference to FIGS. 3 and 4.

Figure 3:
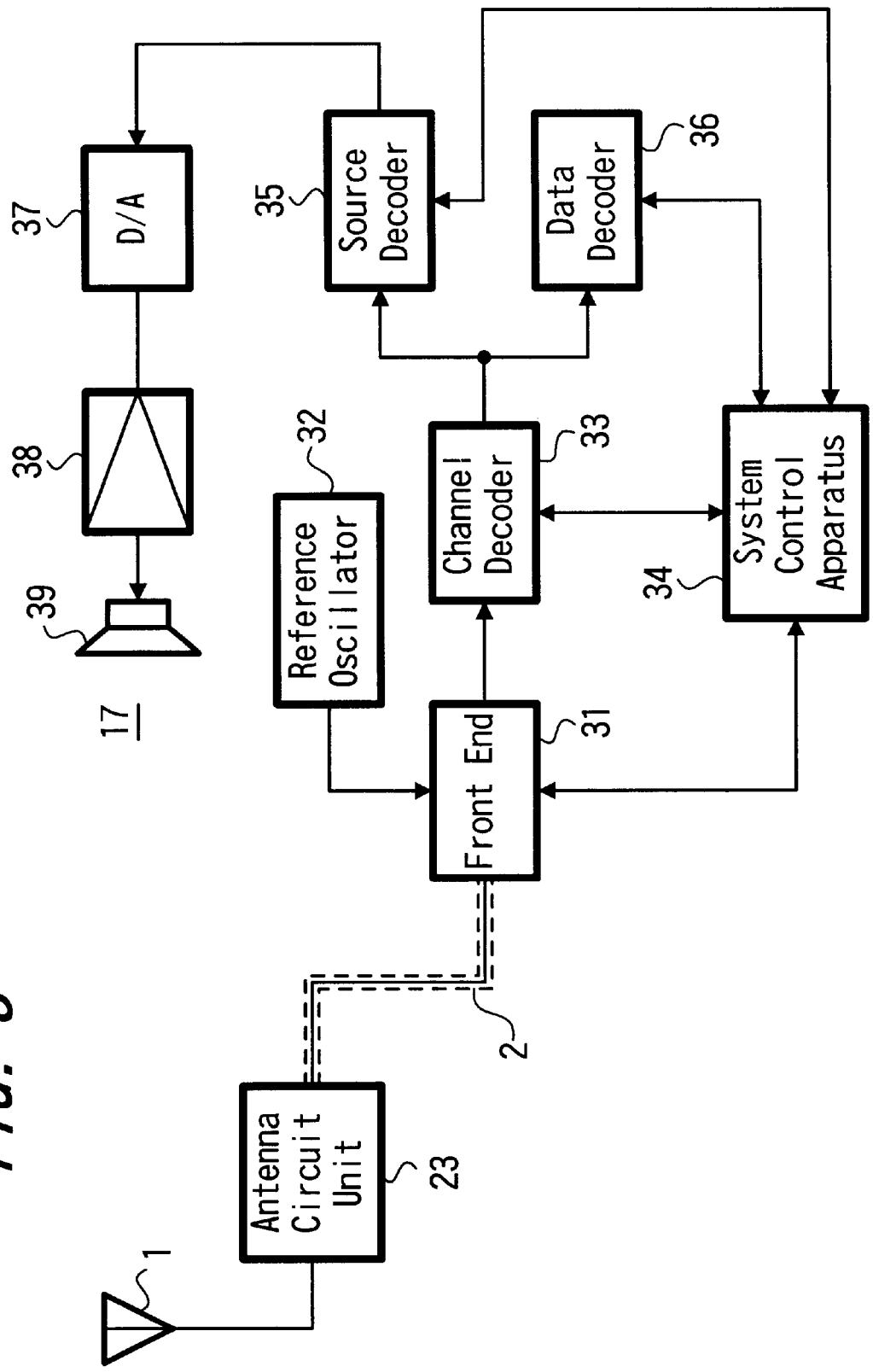
FIG. 3 is a systematic diagram showing a DAB receiver to which the receiving apparatus according to the present invention is applied.
Figure 4:
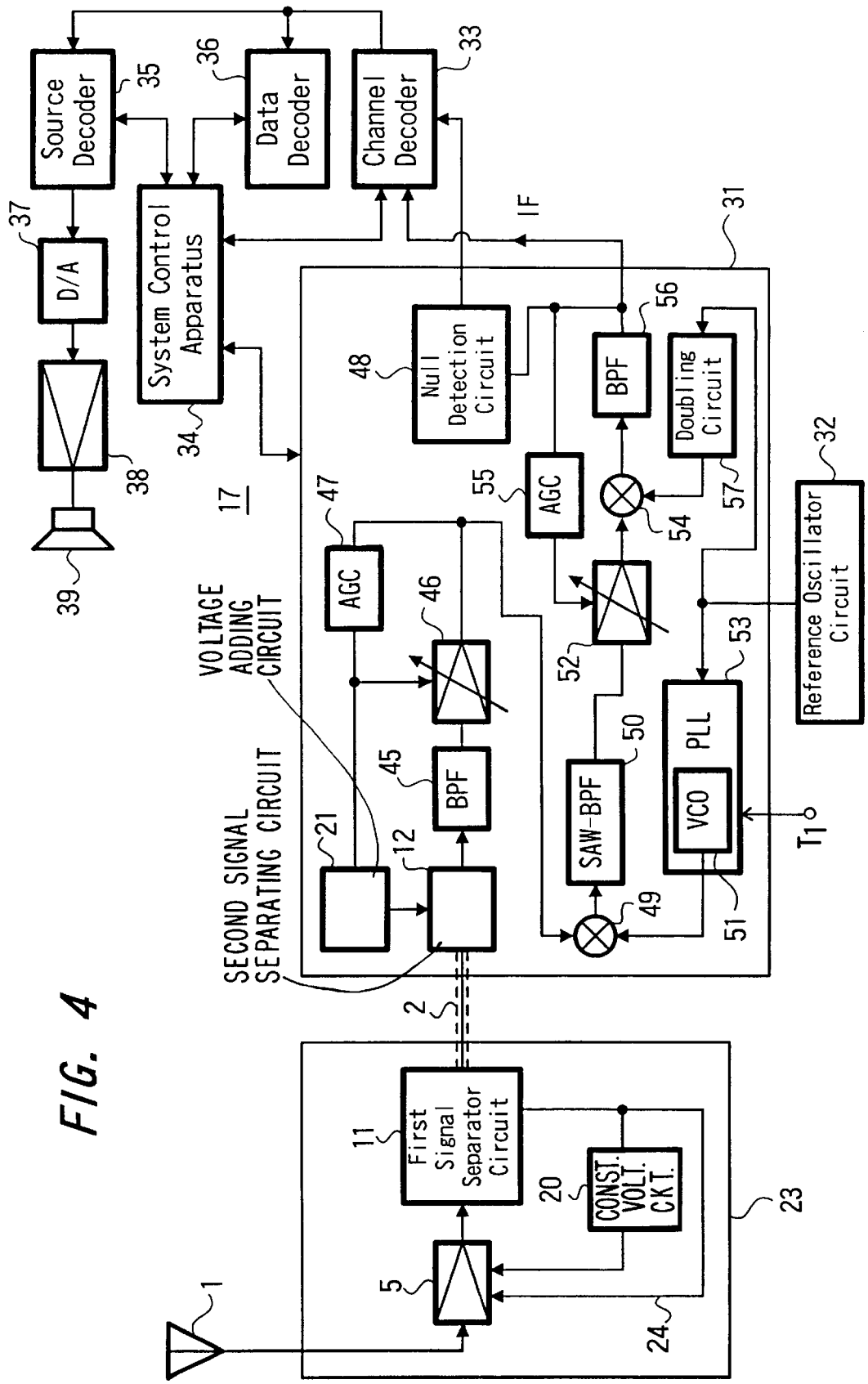
FIG. 4 is a systematic diagram showing a detailed arrangement of a high-frequency unit of the DAB receiver.

FIG. 3 is a diagram showing a rough circuit arrangement of the DAB receiver. FIG. 4 is a diagram showing a detailed circuit arrangement of the DAB receiver. Referring to FIG. 3, a high-frequency received signal in a frequency band of 1.4 GHz and a high-frequency received signal in a frequency band ranging from 170 GHZ to 240 GHz, both of which are received by a reception antenna 1, are supplied through the reception antenna 1 and an antenna circuit unit 23 to a front end 31 of a receiving circuit unit 17. The front end 31 is supplied with a reference oscillation signal of 17.92 KHz from a reference oscillator 32 which will be described later on with reference to FIG. 4. The receiving circuit unit 17 has a channel decoder 33, a system control apparatus and so on, other than the front end 31. The front end 31 converts the supplied high-frequency received signal into an intermediate frequency signal. This intermediate frequency signal is supplied to the channel decoder 33. Then, the channel decoder 33 decodes the supplied intermediate frequency signal.

A decoded output signal from the channel decoder 33 is supplied to a source decoder 35. The source decoder 35 decodes the supplied signal to thereby obtain a digital audio signal. The decoded output signal from the channel decoder 33 is also supplied to a data decoder 36. The data decoder 36 decodes the supplied signal to thereby obtain data other than the digital audio signal. The digital audio signal supplied form the source decoder 35 is supplied to a D/A converter 37. The D/A converter 37 converts the supplied digital audio signal into an analog audio signal, and then supplies the analog audio signal through a low-frequency amplifier circuit 38 to a speaker 39.

The system control apparatus 34 formed of a microcomputer controls the front end 31, the channel decoder 36, the source decoder 35 and the data decoder 36.

The DAB receiver arranged such that radio waves of the high-frequency signals in the frequency band of 1.4 GHz and the frequency band of 170 MHz to 240 MHz are received by using one reception antenna 1 will be described in detail with reference to FIG. 4.

The antenna circuit unit 23 shown in FIG. 4 has an arrangement similar to that described with reference to FIG. 1 and hence needs not to be described in detail. The received high-frequency signal is supplied through a first signal separating circuit 11 and a coaxial cable 2 having length of 4 to 5 meters to a second signal separating circuit 12.

A high-frequency amplifier circuit 5 of the antenna circuit unit 23 amplifies a high-frequency component of the high-frequency received signal from the reception antenna 1 and supplies an amplified output (hereinafter referred to as an RF signal) through the coaxial cable 2 to the second signal separating circuit 12 of the front end 31. The RF signal separated by the second signal separating circuit 12 is supplied to a band-pass filter (BPF) 45. The BPF 45 filters a desired received signal among the RF received signals in the frequency band of 1.4 GHz and the RF received signals in the frequency band of 170 KHZ to 240 MHz and supplies the output signal to a variable gain amplifier circuit 46 for amplifying the supplied signal. A gain of the variable gain amplifier circuit 46 is controlled based on a gain control signal from an AGC 47, and the variable gain amplifier circuit 46 supplies an AGC voltage to a voltage adding circuit 21 described with reference to FIG. 1.

The system control apparatus 34 has, though not shown, an interface provided in a system control and connected with a plurality of channel selection keys for the frequency band of 1.4 GHz and with a plurality of channel selection keys for the frequency band of 170 MHZ to 240 MHz. When a user selects and operates one of the channel selection keys, a channel selection control signal corresponding to the selected channel selection key is supplied to frequency-division-ratio setting circuits of a voltage adding circuit 21 and a phase locked loop (PLL) circuit 53 in the front end 31.

A reference oscillation signal having a frequency of 17.92 MHz from a reference oscillator circuit 32 is supplied to a comparator circuit of the PLL circuit 53. The PLL circuit 53 has a voltage control oscillator (VCO) circuit 51. A frequency control signal of the PLL circuit 53 is controlled based on the channel selection control signal supplied from the system control apparatus 34, i.e., an oscillation frequency of the VCO 51 is controlled in response to a channel selection frequency. The VCO 51 supplies a locally oscillation signal to a frequency converter circuit 49. The frequency converting circuit 49 converts the RF signals in the frequency bands of 1.4 GHz and of 170 MHz to 240 MHz supplied thereto from the BPF 45 through the variable gain amplifier circuit 46 into a first IF signal in a frequency band of 38.912 MHz.

The first RF signal from the frequency converting circuit 49 is supplied through a surface acoustic wave band-pass filter (SAW-BPF) 50 to the variable gain amplifier circuit 52. The variable gain amplifier circuit 52 amplifies the first IF signal. A gain of the variable gain amplifier circuit 52 is controlled based on the gain control signal from an AGC 55. The variable gain amplifier circuit 52 supplies the first IF signal having a frequency in the frequency band of 38.912 MHz to a frequency converting circuit 54. A doubling circuit 57 is supplied with the reference oscillation signal having a frequency of 17.92 MHz from the reference oscillation circuit 32 and then doubles a frequency of the supplied reference oscillation signal to supply the obtained local oscillation signal having a frequency of 35.84 MHz to the frequency converting circuit 54. Thus, the frequency converting circuit 54 converts the first IF signal having a frequency of 38.912 MHz and supplied thereto from the variable gain amplifier circuit 52 into a second IF signal having a frequency of 3.072 MHz, and then supplies the second IF signal through a BPF 56 whose pass band center frequency is 3.072 MHz, to the AGC 55 and a null detecting circuit 48. The AGC 55 generates the gain control signal used for controlling the gain of the variable gain amplifier 52. The null detecting circuit 48 detects a null symbol from a frame. Based on the detected null symbol, the null detecting circuit 48 outputs a time sync. signal to the channel decoder 33. Thus, a frame unit can be recognized.

The IF signal is converted into an analog signal through the channel decoder 33 and the source decoder 35 having arrangements similar to those shown in FIG. 3.

In the above arrangement, the AGC signal of the AGC 47 of the front end 31 is supplied to the voltage adding circuit 2, and a DC voltage for each channel selection signal supplied to an input terminal $T_1$ of the PLL 53 is derived from the VCO 51 or the input terminal $T_1$ and then supplied to the voltage adding circuit 21, thereby the high-frequency amplifier circuit 5 of the antenna circuit unit 23 is able to be controlled through the first and second signal separating circuits 11 and 12 in response to the electric field intensity.

According to the receiving apparatus of the present invention, since the high-frequency gain of the reception antenna can be changed in response to the frequency band of the received signal and the electric field intensity of the received signal, it is possible to stably receive a transmitted wave by correcting different high-frequency gains resulting from different reception electric field intensities which differ from one another depending upon a frequency.

Without providing antennas dedicated for respective reception bands, it is possible to stably receive a transmitted wave with using only one antenna, by canceling differences of the reception electric field intensities. Since it is not necessary to provide a special wiring between the antenna and the receiver other than a coaxial cable, if the present invention is applied to a receiver such as a car-mount type receiver, a portable receiver or the like in which provision of the antenna is limited in view of a space, then it is possible to achieve effects of reducing a space for an antenna and of reducing manufacturing costs of the receiver.

Especially, the present invention can provide a receiving apparatus suitable for receiving broadcasting waves of a plurality of broadcasting frequency bands spaced at an interval as employed by the DAB system.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A receiving apparatus comprising:
    a reception antenna unit having a high-frequency amplifier circuit for receiving a plurality of signals of different frequency bands represented by respective selectable channels;
    a receiving unit, wherein said reception antenna unit and said receiving unit are connected to each other through a transmission line; and
    means for supplying an automatic gain control voltage derived from said receiving unit through said transmission line to said high-frequency amplifier circuit of said antenna unit in response to a frequency band of a signal received in accordance with each selection of a channel and a reception electric field intensity thereof, thereby controlling a high-frequency gain of said reception antenna unit, wherein
    said reception antenna unit comprises a high-frequency amplifier circuit for amplifying a high-frequency signal from a reception antenna, a first signal separating circuit for transmitting said high-frequency signal to said transmission line and separating said automatic gain control voltage signal from said receiving unit, and a feedback line through which said separated automatic gain control voltage signal is fed back to said high-frequency amplifier circuit;
    said receiving unit comprises a second signal separating circuit for said high-frequency signal transmitted from said antenna unit through said transmission line thereto and said automatic control voltage signal, a tuner circuit for setting the high-frequency signal from said second signal separating circuit to a predetermined channel by a channel setting means, and a voltage adding circuit for adding said automatic gain control voltage signal and a DC voltage for each received channel frequency band selected by said channel setting circuit, and wherein
    said automatic gain voltage signal added with the DC voltage from said voltage adding circuit is supplied to a first signal separating circuit of said reception antenna unit through said second signal separating circuit and said transmission line and then separated thereby, thereafter being supplied through said feedback line to said high-frequency amplifier circuit for controlling said high-frequency amplifier circuit.

2. The receiving apparatus according to claim 1, further comprising:
    a constant voltage circuit provided in said reception antenna unit, wherein said automatic gain voltage signal is supplied to said constant voltage circuit to thereby induce a predetermined voltage therein.

* * * * *